(12) United States Patent
Kim et al.

(10) Patent No.: US 7,813,184 B2
(45) Date of Patent: Oct. 12, 2010

(54) MULTI-BLOCK MEMORY DEVICE ERASING METHODS AND RELATED MEMORY DEVICES

(75) Inventors: Hoo-Sung Kim, Gyeonggi-do (KR); Hyung-Seok Kang, Gyeonggi-do (KR); Jin-Yub Lee, Seoul (KR)

(73) Assignee: Samsung Electronics Co. Ltd. (KR)

( * ) Notice: Subject to any disclaimer, the term of this patent is extended or adjusted under 35 U.S.C. 154(b) by 964 days.

(21) Appl. No.: 11/614,413

(22) Filed: Dec. 21, 2006

(65) Prior Publication Data
US 2008/0074931 A1  Mar. 27, 2008

(30) Foreign Application Priority Data
Sep. 26, 2006  (KR) .................. 10-2006-0093635

(51) Int. Cl.
*G11C 11/00* (2006.01)
(52) U.S. Cl. .............................. 365/185.29; 365/185.11; 365/185.23; 365/218; 365/236
(58) Field of Classification Search ............ 365/185.29, 365/185.11, 185.23, 218, 236
See application file for complete search history.

(56) References Cited

U.S. PATENT DOCUMENTS

| | | | |
|---|---|---|---|
| 5,841,721 A | 11/1998 | Kwon et al. | |
| 5,995,416 A | 11/1999 | Naura et al. | |
| 5,999,446 A | 12/1999 | Harari et al. | |
| 6,671,208 B2 * | 12/2003 | Sumitani et al. | 365/185.23 |
| 7,050,336 B2 | 5/2006 | Tomoeda et al. | |
| 7,532,531 B2 * | 5/2009 | Lee | 365/218 |
| 2005/0248993 A1 * | 11/2005 | Lee et al. | 365/185.29 |
| 2007/0047327 A1 * | 3/2007 | Goda et al. | 365/185.29 |

FOREIGN PATENT DOCUMENTS

| | | |
|---|---|---|
| JP | 2003-331585 | 11/2003 |
| JP | 2004-253021 | 9/2004 |
| JP | 2005-085309 | 3/2005 |
| KR | 100223263 B1 | 7/1999 |
| KR | 102000038416 A | 7/2000 |
| KR | 1020020001251 A | 1/2002 |
| KR | 1020040008532 A | 1/2004 |
| KR | 1020050024248 A | 3/2005 |

* cited by examiner

*Primary Examiner*—Tuan T Nguyen
*Assistant Examiner*—Toan Le
(74) *Attorney, Agent, or Firm*—Myers Bigel Sibley & Sajovec

(57) ABSTRACT

Methods of performing multi-block erasing operations on a memory device that includes a plurality of memory blocks are provided. Pursuant to these methods, the rate at which a first voltage that is applied to the memory blocks that are to be erased during the multi-block erasing operation rises is controlled based on the number of memory blocks that are to be erased. The memory device may be a flash memory device, and the first voltage may be an erasing voltage that is applied to a substrate of the flash memory device. The rate at which the first voltage rises may be set so that the substrate of the flash memory device reaches the erasing voltage level at approximately the same time regardless of the number of memory blocks that are to be erased.

31 Claims, 9 Drawing Sheets

MULTI-BLOCK MEMORY DEVICE ERASING METHODS AND RELATED MEMORY DEVICES

CROSS-REFERENCE TO RELATED APPLICATIONS

This U.S. non-provisional patent application claims priority under 35 U.S.C. §119 from Korean Patent Application No. 2006-93635 filed on Sep. 26, 2006, the entire content of which is hereby incorporated by reference as if set forth in its entirety.

FIELD OF THE INVENTION

The present invention relates to semiconductor memory devices and, more particularly, to electrically erasable and programmable semiconductor memory devices.

BACKGROUND

Semiconductor memory devices are used in a wide range of applications including, for example, digital logic circuits, microprocessors and computers. A steady demand exists for improved methods of manufacturing semiconductor memory devices, including, for example, both methods that reduce the size (and hence increase the level of integration) of the semiconductor memory devices and methods of increasing the operating speeds of the semiconductor memory devices.

Semiconductor memory devices may generally be classified into volatile and nonvolatile memory devices. Exemplary types of volatile memory devices include static and dynamic random access memory (RAM) devices. In static RAM devices, logical information (i.e., binary data) is stored by setting a logical condition of a bistable flipflop loop. In dynamic RAM devices, the logical information is stored as a charge level in a capacitor. Volatile semiconductor memory devices maintain stored data as long as the device is connected to a power supply, but lose the data when the power supply is cut off.

Nonvolatile memory devices include, for example, magnetic read only memory devices (MROM), programmable read only memory devices (PROM), erasable programmable read only memory devices (EPROM) and electrically erasable and programmable read only memory devices (EEPROM). Nonvolatile memory devices are able to retain stored data even when the power supply to the device is cut off. Depending upon the type of device, the stored data may either be immutable (i.e., unchangeable) or reprogrammable. Nonvolatile memory devices are widely used for storing program files and micro-codes in computer, aerospace, communications, customer electronics and numerous other applications. In addition, nonvolatile RAMs (nvRAMs) are often used in systems requiring frequent and high speed transfer and storage of data between volatile and nonvolatile storage modes.

Data stored in MROM, PROM, and EPROM nonvolatile semiconductor memory devices cannot be conveniently reprogrammed by general users because these types of devices generally are not designed to allow users to easily erase the data stored therein. In contrast, EEPROM nonvolatile semiconductor memory devices may be electrically erased and reprogrammed with new data. Consequently, EEPROM devices are typically used in applications where the stored data is updated and/or for auxiliary storage unit applications. In particular, flash EEPROMs (hereinafter, referred to as "flash memory devices"), which can have reasonably high integration densities, are often used in applications requiring large-capacity auxiliary storage units. NAND flash memory devices are often used instead of NOR flash memory devices because NAND flash memory devices generally exhibit higher integration density levels.

Conventional flash memory devices typically comprise a memory cell array that includes a plurality of memory blocks. The memory blocks may be independently operable in reading, erasing and programming operations. In some applications, the time required to erase a memory block or blocks may be a factor that restricts the performance of a system that includes the flash memory device. In order to reduce this erasing time, techniques have been proposed for simultaneously erasing multiple memory blocks of the memory cell array. Techniques for erasing two or more memory blocks of a flash memory device at the same time are disclosed, for example, in U.S. Pat. No. 5,841,721 entitled "MULTI-BLOCK ERASE AND VERIFICATION CIRCUIT IN A NONVOLATILE SEMICONDUCTOR MEMORY VICE AND A METHOD THEREOF" and U.S. Pat. No. 5,999,446 entitled "MULTI-STATE FLASH EEPROM SYSTEM WITH SELECTIVE MULTI-SECTOR ERASE."

As shown in FIG. 1, in erasing memory cells of a flash memory device, a voltage of 0V may be applied to a word line that is connected to the control gates of the flash memory cells, and an erasing voltage Verase, which is typically a high voltage (e.g., 20V), may be applied to the substrate (or a pocket P-well) in which the memory cells are formed. While these voltages are applied, the source and drain regions of each memory cell that is to be erased are conditioned in floating states. Under such bias conditions, charges stored in the floating gate of each memory cell that is to be erased are released into the pocket P-well by Fowler-Nordheim (F-N) tunneling effect. The time that it takes for the voltage of the pocket P-well to reach the erasing voltage Verase is a function of the capacitance between the pocket P-well and the word line (control gate).

During a multi-block erasing operation, word lines of the selected memory blocks that are to be erased are set to, for example, 0V, whereas word lines of deselected memory blocks (i.e., memory blocks that are not being erased) may be conditioned in floating states. When the word line is conditioned in a floating state, there is no capacitance between the pocket P-well and the floating word line. Consequently, the time it takes the voltage of the pocket P-well to reach the erasing voltage Verase may be a function of the number of memory blocks that are erased. For instance, as shown in FIG. 2, when two memory blocks are erased in a multi-block erasing operation, the voltage of the pocket P-well may increase along the solid line denoted by "A." In contrast, when all of the memory blocks are erased in a multi-block erasing operation, the voltage of the pocket P-well may increase along the solid line denoted by "C." Thus, as shown in FIG. 2, the time it takes for the voltage of the pocket P-well to reach the erasing voltage is variable based on the number of memory blocks to be erased and the capacitance between the pocket P-well and the word line.

In FIG. 2, T1 denotes the time at which the voltage of the pocket P-well reaches the erasing voltage when erasing two memory blocks. T2 similarly denotes the time at which the voltage of the pocket P-well reaches the erasing voltage when erasing M memory blocks, and T3 denotes the time at which the voltage of the pocket P-well reaches the erasing voltage when erasing all of the memory blocks.

While the time it takes the voltage of the pocket P-well to reach the erasing voltage is variable depending upon the number of memory blocks that are to be erased, the erasing time is constant regardless of the number of the memory blocks. Consequently, the smaller the number of memory blocks that are erased, the longer the erasing voltage is applied to the pocket P-well. For example, when two memory blocks are erased, the erasing voltage is applied to the pocket P-well for a time period that is ΔT1 longer than the time period for which the erasing voltage is applied to the pocket P-well when all of the memory blocks are erased. Similarly, when M memory blocks are erased (where here M is less than all of the memory blocks, but more than two memory blocks), the erasing voltage is applied to the pocket P-well for a time period that is ΔT2 longer than the time period for which the erasing voltage is applied to the pocket P-well when all of the memory blocks are erased. Thus, the smaller the number of memory blocks selected for erasure, the longer the time for which the erasing voltage is applied to the P-well, which increases the stress on the memory cells of the memory blocks. This stress from the erasing operations may cause deterioration of oxide films in the cell transistors, an increase of charge traps, and/or other problems that may result in a gradual or abrupt degradation in the reliability of the memory cells.

SUMMARY

Pursuant to embodiments of the present invention, methods of performing a multi-block erasing operation on a memory device that includes a plurality of memory blocks are provided. Pursuant to these methods, the rate at which a first voltage that is applied to the memory blocks that are to be erased during the multi-block erasing operation rises is controlled based on the number of memory blocks that are to be erased. In some of these methods, the memory device may be a flash memory device, and the first voltage may be an erasing voltage that is applied to a substrate of the flash memory device. In such methods, the rate at which the first voltage rises may be set so that the substrate of the flash memory device reaches the erasing voltage level at approximately the same time regardless of the number of memory blocks that are to be erased.

In these methods, the first voltage may be set to rise at a slower rate the smaller the number of memory blocks that are selected to be erased in the multi-block erasing operation. The first voltage may be applied to each memory cell of the selected memory blocks that is to be erased as part of the multi-block erasing operation. The word lines of the memory blocks that are to be erased may be driven by a word line voltage and word lines of the remainder of the memory blocks may be conditioned in floating states. The rate at which the first voltage rises may be controlled by doing at least one of (a) adjusting a period of an oscillation signal based on the number of memory blocks that are to be erased and generating the first voltage in response to the oscillation signal having the adjusted period, (b) adjusting a voltage level of an oscillation signal based on the number of memory blocks that are to be erased and generating the first voltage in response to the oscillation signal having the adjusted voltage level or (c) adjusting a capacity of a pump based on the number of memory blocks that are to be erased and generating the first voltage by means of the pump with the adjusted capacity.

Pursuant to further embodiments of the present invention, methods of erasing flash memory devices that includes a plurality of memory blocks are provided. Pursuant to these methods, the number of memory blocks that are to be simultaneously erased is determined. Then, a slope at which an erasing voltage rises is set based on the determined value. The erasing voltage which is set to rise at the set slope is then applied to the substrate in which the memory blocks are formed. In these methods, the slope at which the erasing voltage rises may be set so that the substrate to which it is applied reaches a pre-selected voltage level at approximately the same time regardless of the number of the memory blocks that are to be erased.

In these methods, the number of memory blocks that are to be simultaneously erased may be determined by detecting an input of a multi-block selection command and then counting an input number of block addresses in response to detecting the input of the multi-block selection command. In these methods, the word lines of the memory blocks that are to be simultaneously erased may be driven by a word line voltage and word lines of the remainder of the memory blocks may be conditioned in floating states.

In some embodiments of these methods, the slope at which the erasing voltage rises may be set by adjusting a period of an oscillation signal based on a result of the determination as to the number of memory blocks that are to be simultaneously erased and then generating the erasing voltage in response to the oscillation signal having the adjusted period. In other embodiments, the slope at which the erasing voltage rises may be set by adjusting a voltage level of an oscillation signal based on a result of the determination as to the number of memory blocks that are to be simultaneously erased and then generating the erasing voltage in response to the oscillation signal having the adjusted voltage level. In still other embodiments, the slope at which the erasing voltage rises may be set by adjusting a capacity of a pump based on a result of the determination as to the number of memory blocks that are to be simultaneously erased and then generating the erasing voltage by means of the pump with the adjusted capacity. In these embodiments, the period of the oscillation signal is longer, the voltage level of the oscillation signal is longer, or the capacity of the pump is smaller, the fewer the number of memory blocks that are to be erased. The period of the oscillation signal is adjusted to make a time for which the substrate is at the erasing voltage is more uniform, regardless of the number of the memory blocks that are to be erased.

Pursuant to still further embodiments of the present invention, flash memory devices are provided which include a plurality of memory blocks in a semiconductor substrate. These devices further include a first circuit that is configured to determine the number of memory blocks that are to be erased as part of a multi-block erasing operation. The devices also include a voltage generator that is configured to generate an erasing voltage that is supplied to the semiconductor substrate and a control circuit that is configured to perform multi-block erasing operations in which at least two memory blocks are simultaneously erased. In these devices, the control circuit is configured to control the voltage generator, based at least in part on the determination as to the number of memory blocks that are to be erased, to raise the semiconductor substrate to the erasing voltage for approximately the same time regardless of the number of the memory blocks that are to be erased.

The first circuit may comprise a flag signal generator that is configured to generate a pulsed flag signal in response to an input of a block address that selects a memory block that is to be erased and a counter that is configured to count the number of pulses of the flag signal. In such embodiments, the control circuit may control the voltage generator in response to the counted number of pulses of the flag signal.

The voltage generator may comprise an oscillator that is configured to generate an oscillation signal, a pump that is configured to generate the erasing voltage and a regulator that is configured to control the rate of increase of the erasing voltage in response to the oscillation signal and the erasing voltage. In such embodiments, the control circuit may regulate the oscillator to vary a period of the oscillation signal or a voltage level of the oscillation signal based on the determination as to the number of memory blocks that are to be erased. The period/voltage level of the oscillation signal may be longer the fewer the number of memory blocks that are to be erased. In other embodiments, the control circuit may regulate the pump to vary a capacity of the pump based on the determination as to the number of memory blocks that are to be erased, where the capacity of the pump may be smaller the fewer the number of memory blocks that are to be erased. In various of the above embodiments, the substrate may be a pocket P-well in which the memory blocks are formed.

BRIEF DESCRIPTION OF THE DRAWINGS

The accompanying drawings, which are included to provide a further understanding of embodiments of the present invention and are incorporated in and constitute a part of this application, illustrate certain embodiment(s) of the invention. In the drawings.

DETAILED DESCRIPTION

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this disclosure and the relevant art and will not be interpreted in an idealized or overly formal sense unless expressly so defined herein.

Figure 3:
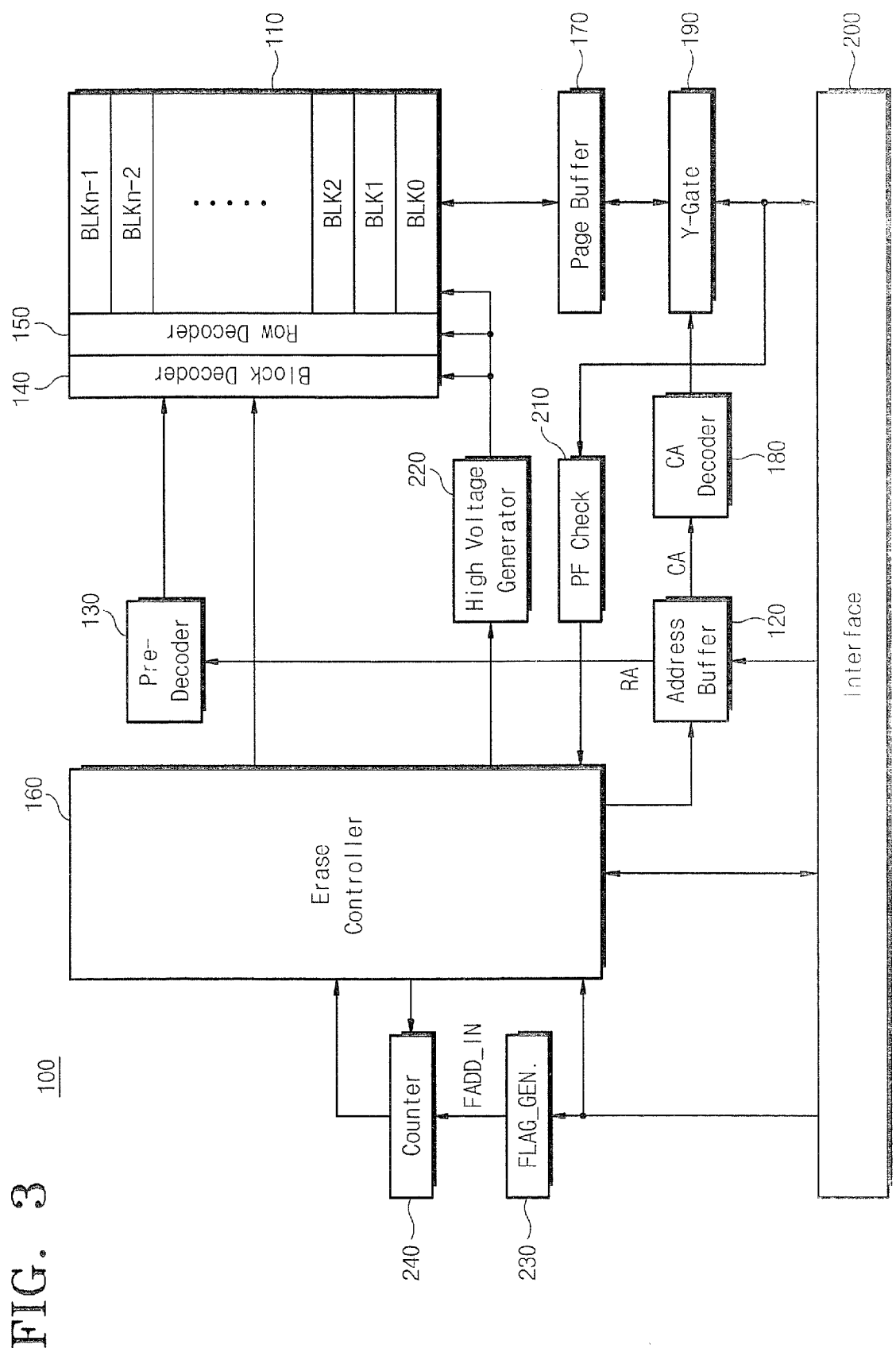
FIG. 3 is a block diagram illustrating a flash memory device in accordance with embodiments of the present invention.

FIG. 3 is a block diagram illustrating a flash memory device according to certain embodiments of the present invention. While the flash memory device depicted in FIG. 3 is a NAND flash memory device, it will be appreciated that in other embodiments of the present invention the memory device may comprise, for example, a PRAM, an MROM, a PROM, a NOR flash memory, etc.

Referring to FIG. 3, the flash memory device 100 includes a memory cell array 110 in which data is stored. The memory cell array 110 comprises a plurality of memory blocks BLK0~BLKn−1. The memory cell array 110 stores N-bit data, where N is a positive integer. The flash memory device 100 also includes an address buffer 120, a pre-decoder 130, a block decoder 140, a row decoder 150, an erase controller 160, a page buffer circuit 170, a column address decoder 180, a column gate circuit 190 (Y-Gate), an interface circuit 200, a pass/fail check circuit 210 and a high voltage generator 220.

The address buffer 120 is regulated by the erase controller 160. The address buffer 120 receives column/row addresses through the interface circuit 200. The pre-decoder 130 decodes the row addresses output from the address buffer 120. The decoded addresses contain block address information for selecting the memory blocks and page address information for selecting pages (or word lines) of a selected memory block. The block decoder 140 is regulated by the erase controller 160. The block decoder 140 selects the memory blocks in response to the block address information output from the pre-decoder 130. When in a multi-block erasing mode, the block decoder 140 is configured to store the block address information of memory blocks that are to be erased, tinder regulation by the erase controller 160, as discussed, for example, in U.S. Pat. No. 5,842,721. The row decoding circuit 150 drives pages of the selected memory block at word line voltages supplied from the high voltage generator 220.

The page buffer circuit 170 includes a plurality of page buffers which are coupled to bit lines (shared by all memory blocks). Each page buffer may function as a sense amplifier or a write driver in accordance with an operation mode. For example, during a reading operation, the page buffer circuit 170 senses page data from the selected memory block through the bit lines. During a programming operation, the page buffer circuit 170 latches data that is to be programmed and drives the bit lines to a power source voltage or a ground voltage in accordance to the latched data. The column address decoder 180 decodes the column addresses output from the address buffer 120, and the column gate circuit 190 selects the page buffers of the page buffer circuit 170 in response to the decoded column addresses from the column decoder 180. During the reading operation, data read by the page buffer circuit 170 is output to an external circuit via the column gate circuit 190 and the interface circuit 200. During the programming operation, data that is to programmed into the memory cell array 110 is transferred into the page buffer circuit 170 via the column gate circuit 190 and the interface circuit 200.

Although not shown in FIG. 3, the column/address decoder 180 may include an address counter that is used to generate the column addresses by sequentially incrementing an initial column address. Thus the page data to be programmed or read out may be transfected through the column gate circuit 190 in the unit of a bit.

The pass/fail check circuit 210 receives page data bits, which are read out by the page buffer circuit 170, through the column gate circuit 190, during an erase-verifying operation. The pass/fail check circuit 210 determines whether the received page data bits are the same as the data that is to be erased (i.e., pass data values). A result of the determination by the pass/fail check circuit 210 is transferred to the erase controller 160. The high voltage generator 220 is regulated by the erase controller 160, generating the word line and erasing voltages necessary for the multi-block erasing and the erase-verifying operations. The word line voltages are transferred to pages (i.e., word lines) of the selected block(s) through the row decoding circuit 150, and the erasing voltage is supplied to a pocket P-well in which memory cells of the memory block are formed.

As is also shown in FIG. 3, the flash memory device 100 further includes a flag signal generator 230 and a counting circuit 240. The flag signal generator 230 and the counting circuit 240 constitute circuitry that may be used to determine the number of memory blocks that are to be erased. The erase controller 160 regulates the high voltage generator 220 in accordance with a result of this determination. The flag signal generator 230 operates to generate a pulsed flag signal FADD_IN in response to the input of a block address. The input of the block address may be detected in various ways. For example, the flag signal generator 230 outputs the pulsed flag signal FADD_IN, which designates the input of the block address, in response to control signals CLE, ALE, /CE, /RE, and /WE. When ALE and /RE are at high levels and CLE and /CE are at low levels, the flag signal generator 230 outputs the pulsed flag signal FADD_IN in sync with a high-to-low transition of the control signal /WE. The counting circuit 240 operates to count the number of pulses of the flag signal FADD_IN. Counted values by the counting circuit 240 are provided to the erase controller 160. The counting circuit 240 is initiated by the erase controller 160 when a multi-block selection command is first input thereto. The multi-block selection command is used to designate the input of the block address.

The erase controller 160 operates to control the high voltage generator 220. In particular, the erase controller 160 regulates the high voltage generator 220 to vary the slope of the rising edge of the erasing voltage Verase based on the number of memory blocks to be erased. For example, when the number of memory blocks to be erased is small, the erase controller 160 controls the high voltage generator 220 to cause the erasing voltage Verase to increase to a target level at a relatively slow rate. When the number of memory blocks to be erased is larger, the erase controller 160 controls the high voltage generator 220 to cause the erasing voltage Verase to increase to a target level at a relatively rapid rate. The count-up operation of the counting circuit 240 may be regulated directly by the erase controller 160 without the flag signal generator 230.

As aforementioned, it is possible to reduce or minimize degradation of the reliability of the memory cells due to the stress of erasure by varying the slope of the rising edge of the erasing voltage based on the number of memory blocks that are to be erased.

Figure 4:
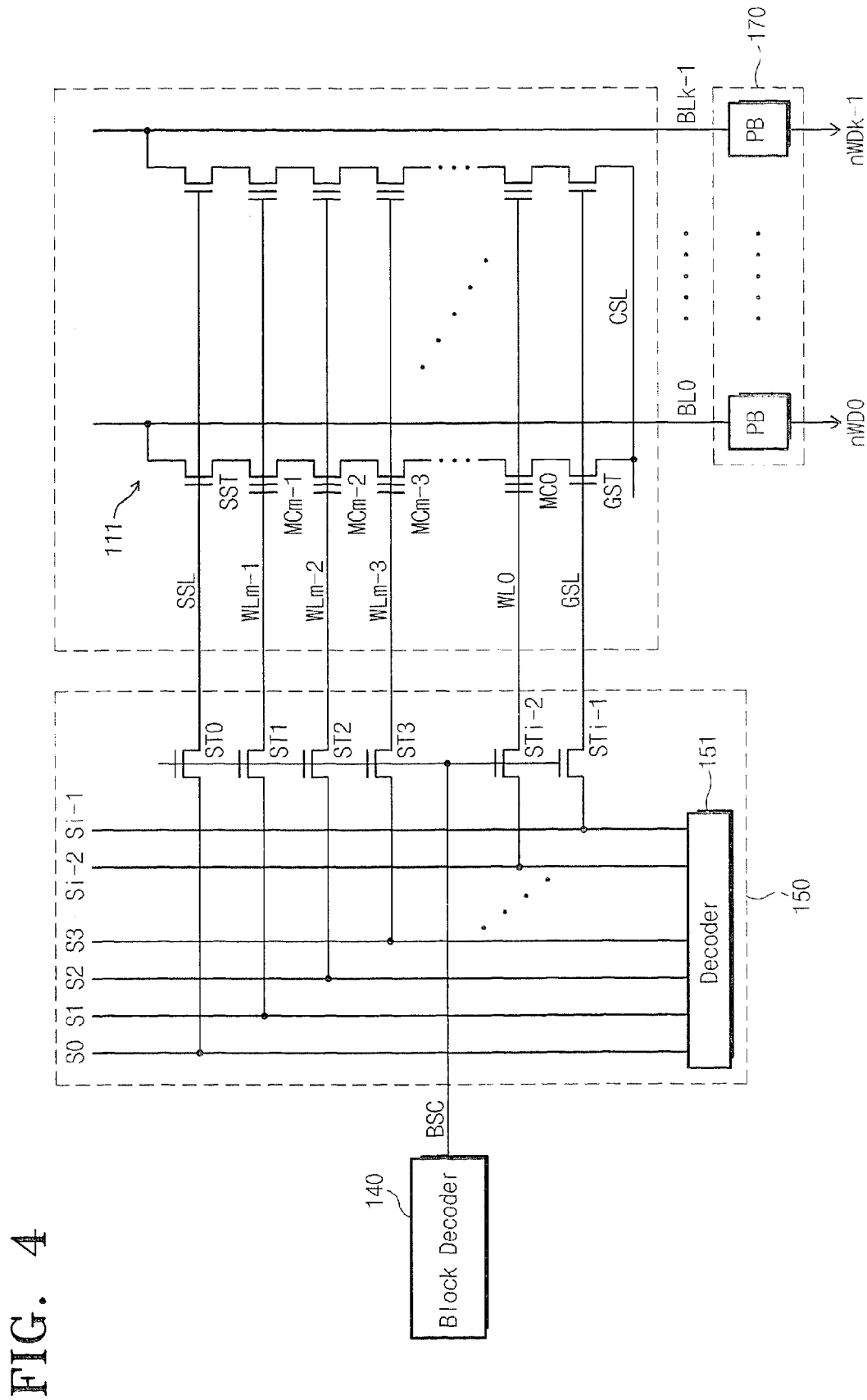
FIG. 4 is a schematic diagram illustrating a row decoding circuit, a block decoder, and a page buffer circuit according to embodiments of the present invention.

FIG. 4 is a schematic diagram illustrating embodiments of the row decoding circuit 150, the block decoder 140 and the page buffer circuit 170 of FIG. 3 according to certain embodiments of the present invention.

As shown in FIG. 4, the memory block BLK0 includes a plurality of strings 111. Each string 111 may comprise a string selection transistor SST, a ground selection transistor GST, and a plurality of memory cells MC0~MCm–1 that are serially connected between the selection transistors SST and GST. Each string 111 is connected to a corresponding one of the bit lines BL0~BLk–1. The bit lines BL0~BLk–1 are arranged to be shared by the memory blocks BLK0~BLKn–1 in the memory cell array 110. In each string 111 the string selection transistor SST is coupled to a string selection line SSL; the ground selection transistor GST is coupled to a ground selection line GST; and the memory cell transistors MCm–1~MC0 are coupled to respective of the word lines WL0~WLm–1.

The string selection line SSL, the word lines WLm–1~WL0, and the ground selection line GSL are connected to their corresponding selection lines S0~Si–1 through selection transistors ST0~STi–1. During the multi-block erasing operation, the selection lines S0 and Si–1 are conditioned in floating states while the selection lines S1~Si–2 are set to the ground voltage. The selection transistors ST0~STi–1 may constitute the row decoding circuit 150. The row decoding circuit 150 also includes a decoder 151 for transferring voltages to corresponding selection lines from the high voltage generator 220 of FIG. 3 in response to the page address information provided from the pre-decoder 130.

As shown in FIG. 4, gates of the selection transistors ST0~STi–1 are commonly coupled to a block selection line BSC. The block selection line BSC is controlled by the block decoder 140. The block decoder 140 is controlled by the erase controller 160, which activates or inactivates the block selection line BSC in response to block address information. The page buffer circuit 170 includes a plurality of page buffers PB that are each coupled to respective ones of the bit lines BL0~BLk–1. The page buffers PB output data values nWD0~nWDk–1, which are read by the erase-verifying operation, to the pass/fail check circuit 210 of FIG. 3 through the column gate circuit 190. The data values nWD0~nWDk–1 may be used to determine whether the memory block has been normally erased.

In the embodiment of FIG. 4, each page buffer PB is coupled to a single bit line. However, it will be appreciated that in other embodiments some or all of the page buffers may be coupled to two or more bit lines.

Figure 5:
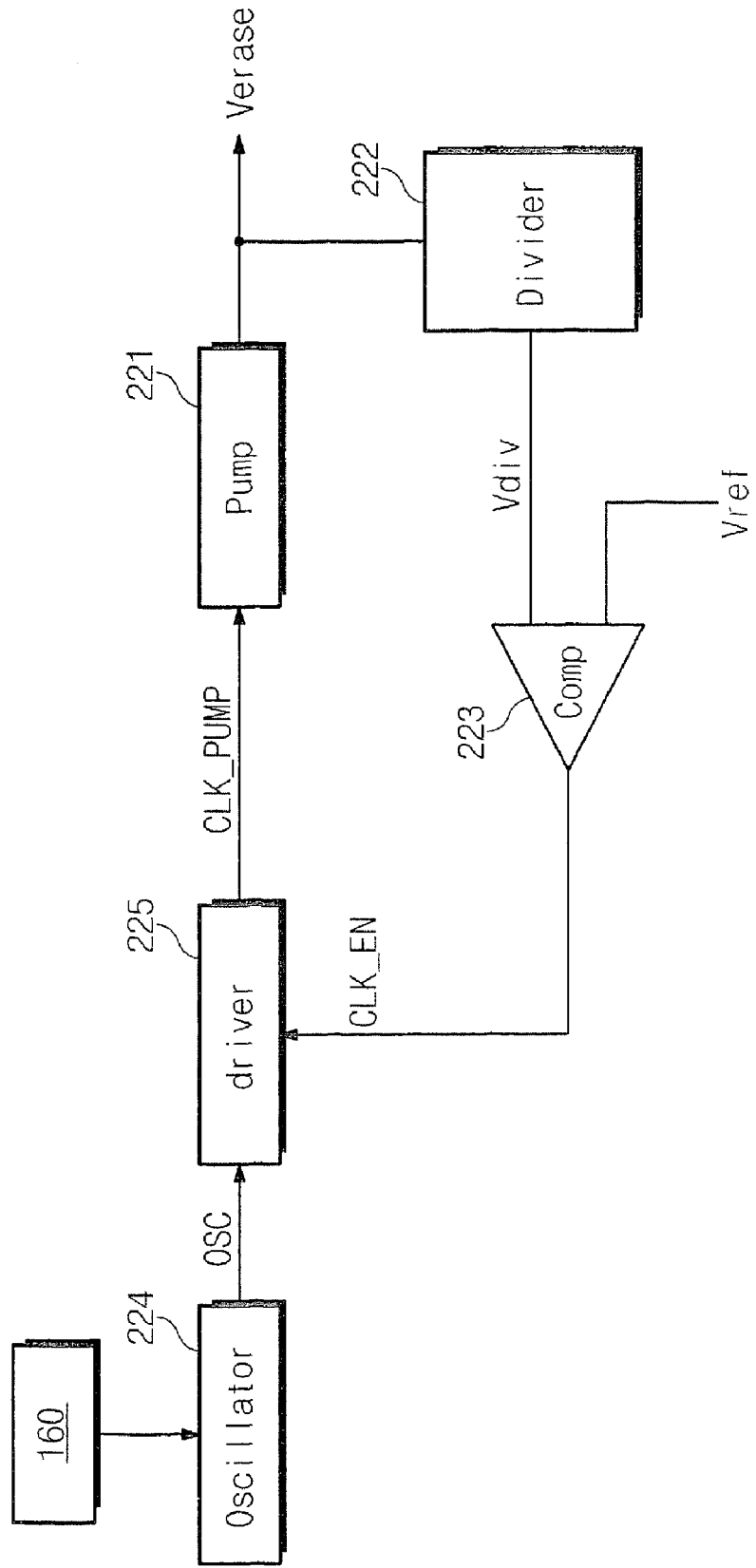
FIG. 5 is a block diagram illustrating certain embodiments of the high voltage generator shown in FIG. 3.

FIG. 5 a block diagram that illustrates part of the high voltage generator 220 of FIG. 3. The high voltage generator 220 may be configured as an erasing voltage generator, a pass voltage generator, and/or a program voltage generator. FIG. 5 shows the high voltage generator configured as an erasing voltage generator.

The high voltage generator 220, i.e., the erasing voltage generator, includes a pump 221, a voltage divider 222, a comparator 223, an oscillator 224 and a clock driver 225. The voltage divider 222, the comparator 223 and the clock driver 225 constitute a regulator circuit that is used to maintain an output voltage of the high voltage generator 220 at a constant level.

The pump 221 generates the erasing voltage Verase in response to a clock signal CLK_PUMP provided from the clock driver 225. The voltage divider 222 divides the output voltage of the pump 221 (i.e., the erasing voltage Verase) to provide a divided voltage Vdiv to the comparator 223. The comparator 223 compares the divided voltage Vdiv of the voltage divider 222 with a reference voltage Vref and generates a clock enable signal CLK_EN based on the result of the comparison. For example, if the divided voltage Vdiv from the voltage divider 222 is lower than the reference voltage Vref or if the erasing voltage Verase does not still reach a target level, the comparator 223 activates the clock enable signal CLK_EN. The clock driver 225 outputs an oscillation signal OSC (provided from the oscillator 224) as a clock signal CLK_PUMP, in response to the clock enable signal CLK_EN. When the clock enable signal CLK_EN is activated, the clock driver 225 outputs the clock signal CLK_PUMP from the oscillation signal OSC. As a result, the pump 221 operates to raise the erasing voltage Verase up to the target level. When the clock enable signal CLK_EN is inactivated, the oscillation signal OSC is interrupted and therefore stops toggling the clock signal CLK_PUMP. This means that the pump 221 does not operate further.

The oscillator 224 of the erasing voltage generator 220 according to embodiments of the present invention is regulated by the erase controller 160 of FIG. 3. In particular, the erase controller 160 regulates the oscillator 224 to vary a cycle period of the oscillation signal OSC based on the number of memory blocks that are to be erased. In this particular embodiment, when all of the memory blocks are to be selected, the cycle period of the oscillation signal OSC is shorter than the cycle period in the case when only some of the memory blocks are selected. Thus, the cycle period of the oscillation signal OSC becomes shorter as the number of memory blocks that are to be erased increases. As the period of the oscillation signal OSC increases, the time that it takes the erasing voltage Verase to reach the target voltage likewise increases.

In this embodiment, the period of the oscillation signal OSC may be set to a default value when all memory blocks are selected.

As discussed above, when the number of memory block that are to be erased is smaller, the capacitance between the pocket P-well and the word lines is lower than it otherwise is when the number of memory blocks to be erased is larger. Thus, the time that it takes to reach the target level of the erasing voltage Verase is shorter when the number of memory blocks that are to be selected is small, and is longer when the number of memory blocks that are to be selected is larger. This time difference arises from the number of memory blocks to be erased. Therefore, flash memory devices according to embodiments of the present invention may reach the target level for the erasing voltage Verase in a more uniform time period by varying the rising slope of the erasing voltage Verase.

Figure 9:
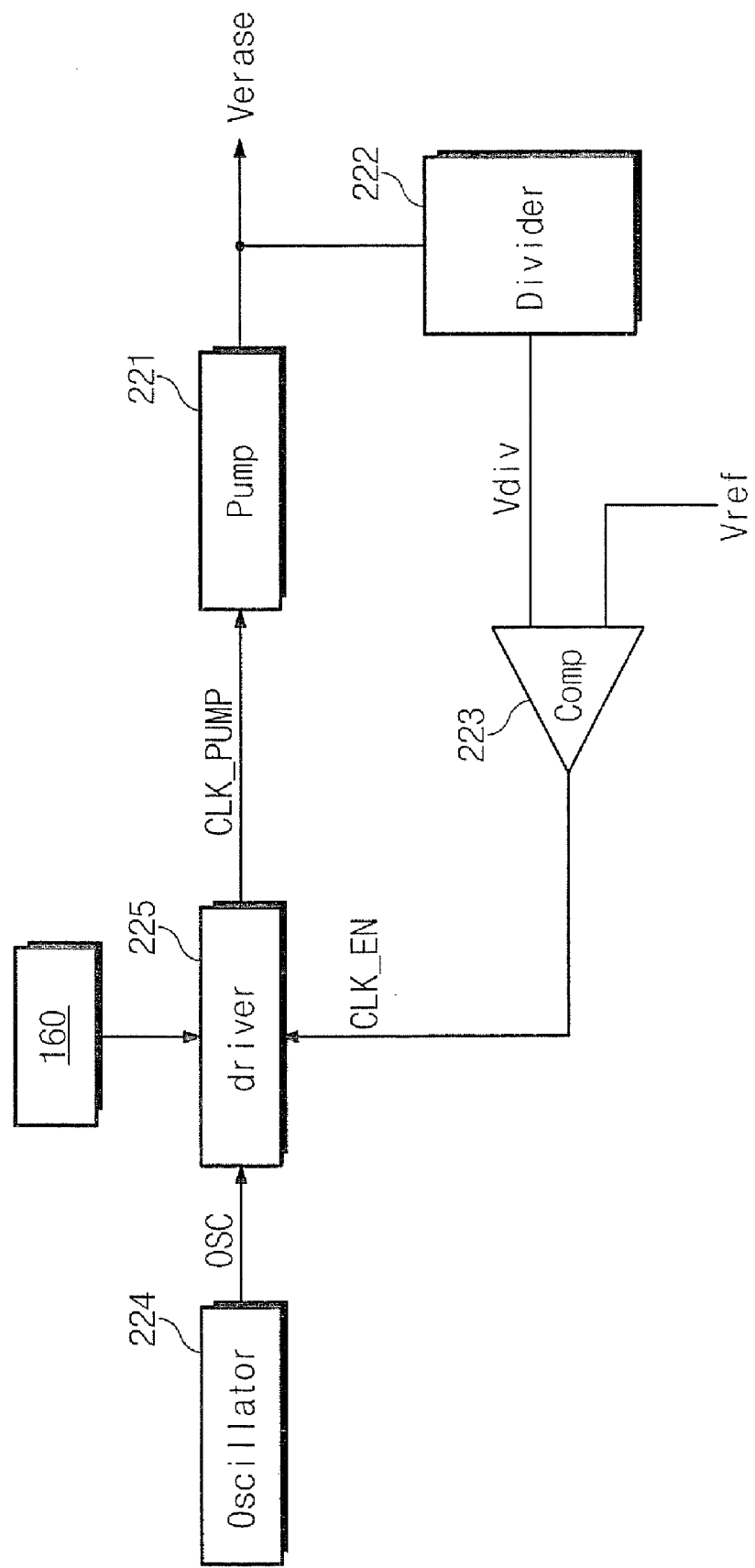
FIGS. 9 and 10 are block diagrams illustrating alternative embodiments of the high voltage generator shown in FIG. 3.
Figure 10:
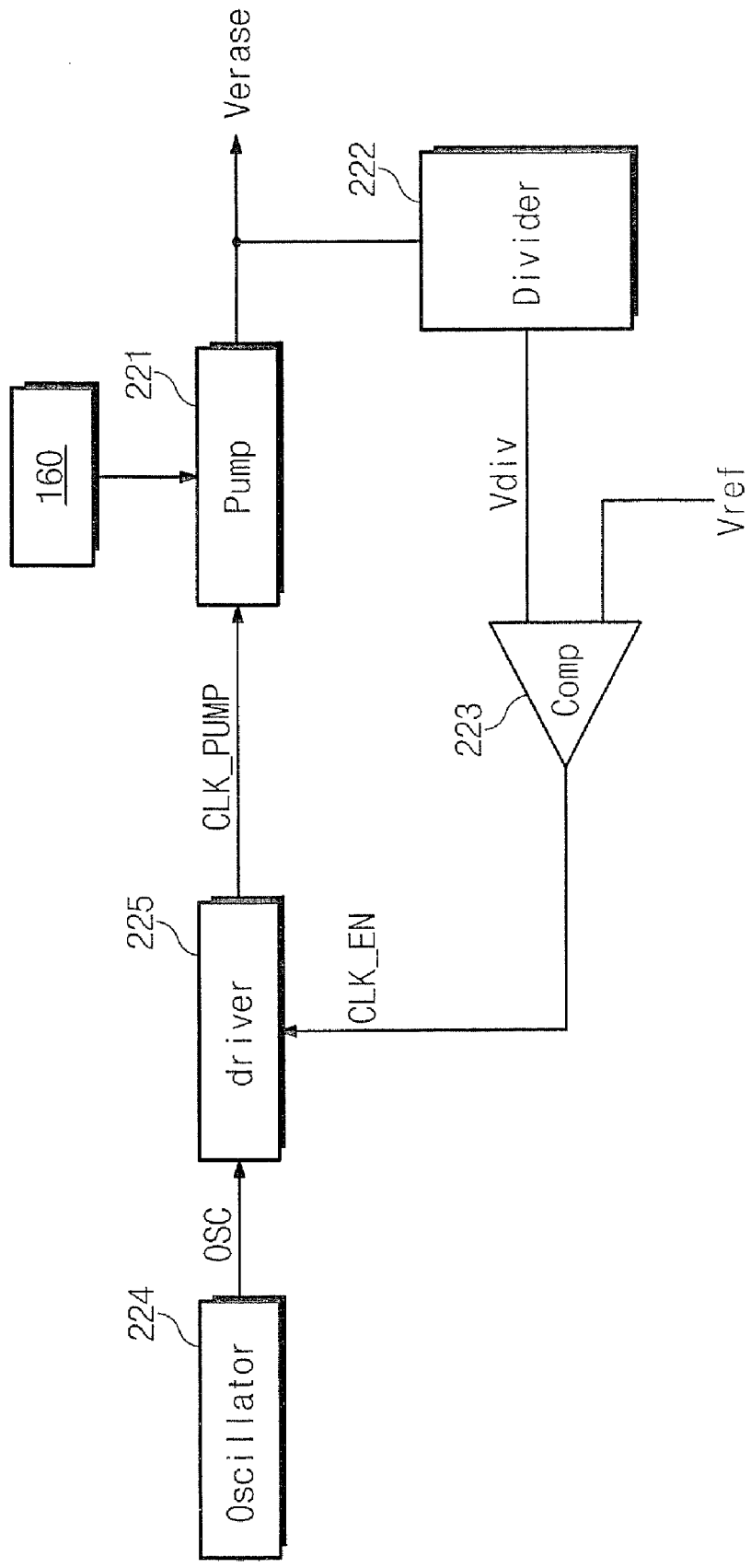

In further embodiments of the present invention, the rising slope of the erasing voltage Verase may be controlled in various other ways. For example, as shown in FIG. 9, the rising slope of the erasing voltage Verase may be controlled by a voltage level of the pumping clock signal CLK_PUMP provided from the clock driver 225 based on the number of memory blocks that are to be erased. Otherwise, as shown in FIG. 10, it is also able to set a rising slope of the erasing voltage Verase by controlling a capacity of the pump 221 based on the number of memory blocks that are to be erased.

Figure 6:
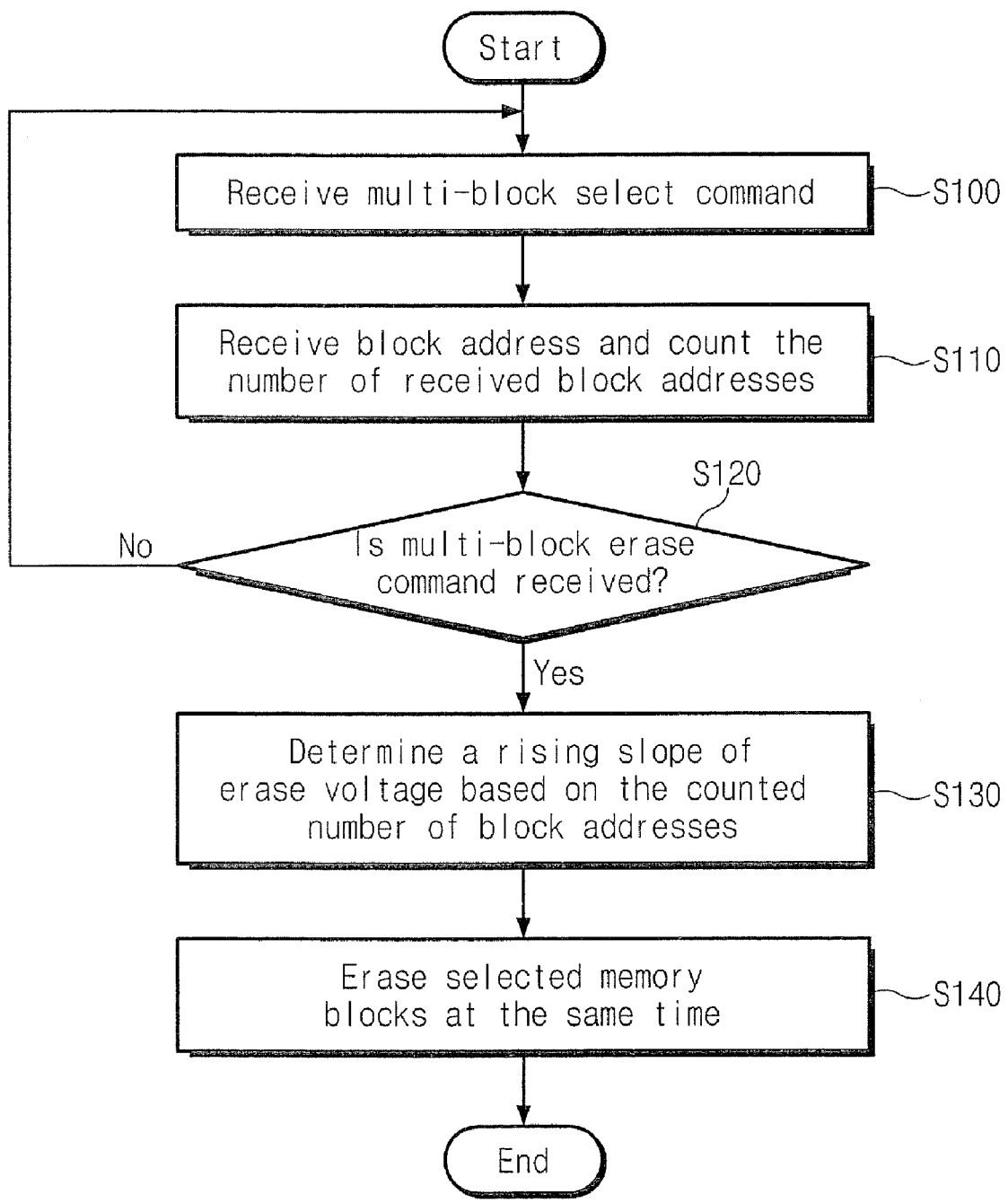
FIG. 6 is a flow chart illustrating a multi-block erasing method according to certain embodiments of the present invention.
Figure 7:
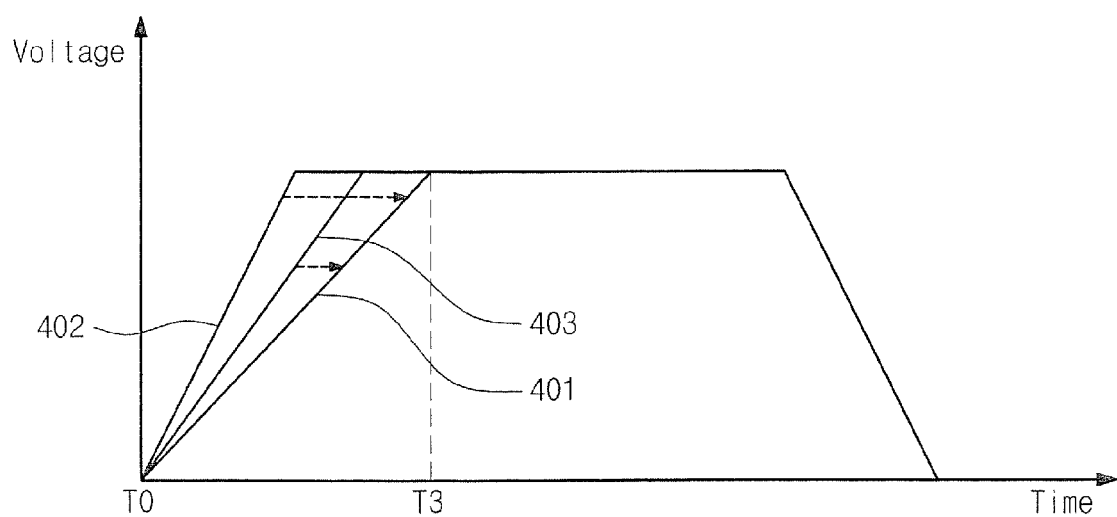
FIG. 7 is a graph illustrating variation in the rising slope of an erasing voltage based on the number of memory blocks that are to be erased during a multi-block erasing operation.

FIG. 6 is a flow chart illustrating a multi-block erasing method in accordance with certain embodiments of the present invention, and FIG. 7 is a graph showing how the rising slope of the erasing voltage Verase may vary based on the number of memory blocks that are to be erased during the multi-block erasing operation.

In order to partially or completely erase one or more memory blocks, the block addresses for the memory blocks that are to be erased are first latched into the block decoder 140. As shown in FIG. 6, in order to accomplish this, a multi-block selection command may first be provided to the flash memory device 100 (Block S100). Next, the block address for a memory block that is to be erased is transferred through the interface circuit 200, the address buffer 120, and the pre-decoder 130, and the transferred block address is latched into the block decoder 140 (Block S110). This may be repeated for a plurality of block addresses, and a count is kept of the number of received block addresses. This counting may be accomplished, for example, by having the flag signal generator 230 output the flag signal FADD_IN in response to the input of the block address, and the counter 240 counts the number of times the flag signal FADD_IN is activated. As discussed above, the counter 240 may be initialized by the erase controller 160 at the time the first multi-block selection command is input.

At Block S120 of FIG. 6, the erase controller 160 determines whether a multi-block erasing command has been input. If not, operations return to Block S100, and the operations of Blocks S100~S120 are repeated until a multi-block erasing command is received. If, at Block S120, it is determined that a multi-block erasing command has been received, operations proceed to Block S130 of FIG. 6, where the rising slope of the erasing voltage Verase is set based on the counted number of block addresses.

Figure 1:
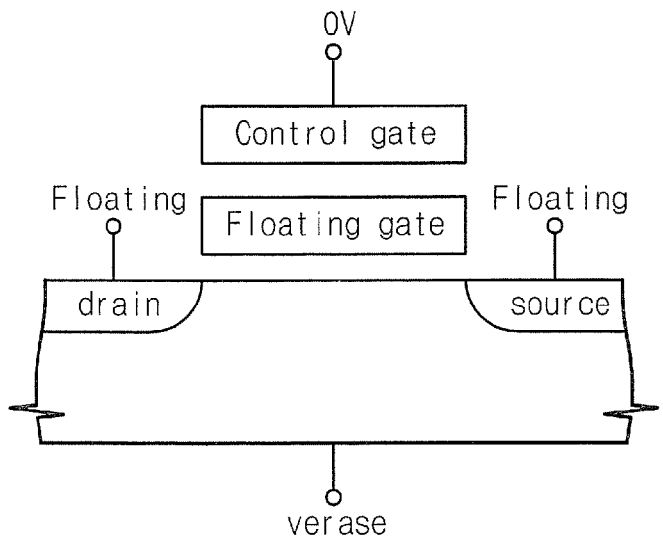
FIG. 1 is a schematic cross-sectional diagram illustrating a bias condition for a flash memory cell.
Figure 2:
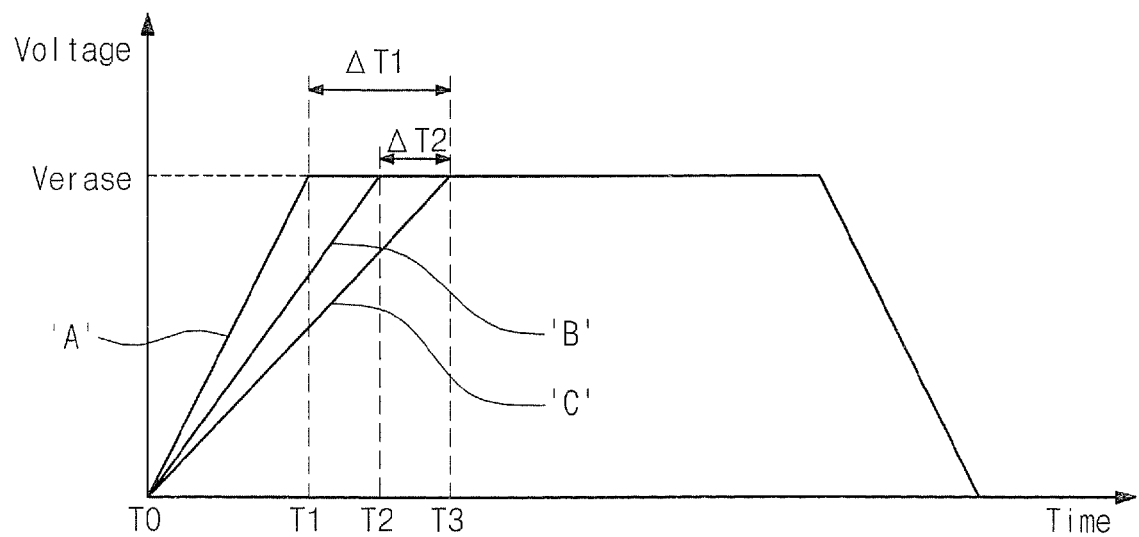
FIG. 2 is a graph illustrating how the time it takes to reach an erasing voltage may vary based on the number of memory blocks that are to be erased.

As an example, when all of the memory blocks of the memory cell array 110 are selected, the oscillation signal OSC may be generated using a default period. It this case, the erasing voltage Verase may, for example, increases along a solid line 401 shown in FIG. 7. When, instead, only a subset of the memory blocks of the memory cell array 110 are selected (e.g., M memory blocks are selected, where, in this example, M is greater than two but less than the total number of memory blocks), the erase controller 160 regulates the oscillator 224 to generate an oscillation signal OSC that has a longer cycle period than the default value. As discussed above with respect to FIG. 2, in a conventional memory device the slope of the rise in the erasing voltage under these circumstances would normally track line 403 in FIG. 7, However, as a result of the lengthening of the period of the oscillation signal OSC to be longer than the default value, the slope of the rise in the erasing voltage Verase is changed to the solid line 401 shown in FIG. 7. Similarly, when two memory blocks of the memory cell array 110 are selected, the erase controller 160 controls the oscillator 224 to generate an oscillation signal OSC that has a longer cycle period than either the default value or the value in the case when M memory blocks are selected (M>2). As a result, the slope of the rise in the erasing voltage Verase again tracks the solid line 401 shown in FIG. 7 (where in conventional devices it would instead track the solid line 402 in FIG. 7.

Turning again to FIG. 6, at Block S140 the selected memory cells are simultaneously erased. After the selected memory cells are erased, the procedure is terminated. The erase-verifying operation for detecting whether the selected memory blocks have been successfully erased may be carried out subsequent to the erasing operation. In some embodiments, the erase-verifying operation may be carried out according to the erase-verifying command and block address provided from an external source after completion of the erasing operation.

The flash memory devices according to embodiments of the present invention may provide a more uniform time for reaching the target level of the erasing voltage Verase, as shown in FIG. 7, by varying a rising slope of the erasing voltage Verase based on the number of memory blocks that are to be erased. As a result, the memory cells may be stressed in a more uniform manner and/or rate during erasing operations.

Figure 8:
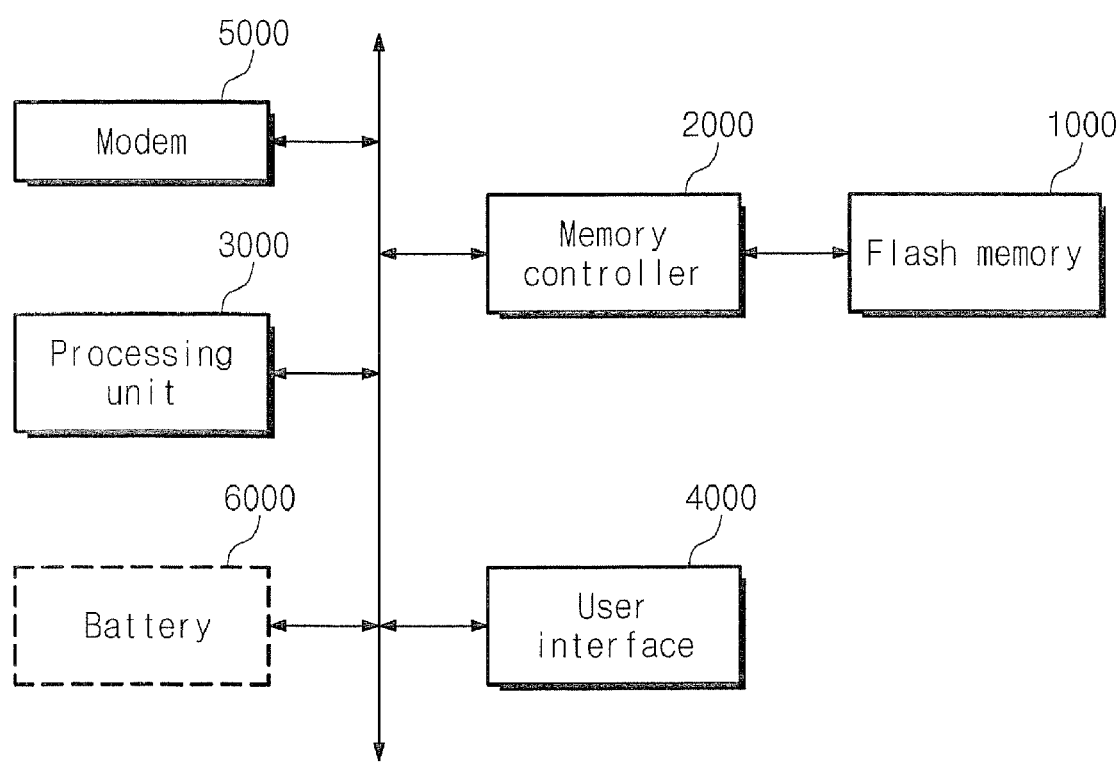
FIG. 8 is a block diagram illustrating a computing system including a flash memory device according to embodiments of the present invention.

As noted above, flash memory devices are nonvolatile memory devices that maintain stored data even when the power supply to the device is cut off. With the rapid increase in the use of mobile apparatuses such as cellular telephones, personal digital assistants (PDA), digital cameras, portable gaming consoles and MP3 players, to name a few, flash memory devices are now being used widely for both code and data storage. Flash memory devices according to embodiments of the present invention may be used in such mobile apparatuses, as well as in, for example, home applications such as high-definition TVs, digital versatile disks (DVDs), routers, and global positioning systems. FIG. 8 is a block diagram illustrating an exemplary computing system that includes a flash memory device according to certain embodiments of the present invention. As shown in FIG. 8, the computing system includes a processing unit 3000 such as a microprocessor or a central processing unit, a user interface 4000, a modem 5000 such as a baseband chipset, a memory controller 2000 and the flash memory device 1000. The flash memory device 1000 may be configured, for example, as shown in FIG. 3. In the flash memory device 1000, N-bit data (N is a positive integer) that is to be processed by the processing unit 3000 is provided through the memory controller 2000. If the computing system shown in FIG. 8 is a mobile apparatus, it may further include a battery 6000. Although not shown in FIG. 8, the computing system may be further equipped with an application chipset, a camera image processor (e.g., CMOS image sensor; CIS), a mobile DRAM, etc.

In the flash memory devices according to embodiments of the present invention, the erasing time may be reduced in some situations by controlling the rising slope of the erasing voltage based on the number of memory blocks that are to be erased. This feature can be accomplished, for example, by adjusting a cycle period of an oscillation signal OSC, a voltage level of the oscillation signal OSC, or a capacity of the pump 221.

As described above, a more uniform time for reaching the target level of the erasing voltage Verase (or a time for applying the erasing voltage) may be achieved according to embodiments of the present invention by varying a rising slope of the erasing voltage Verase based on the number of memory blocks to be erased.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A method of performing a multi-block erasing operation on a memory device that includes a plurality of memory blocks, the method comprising:
   controlling a rate at which a first voltage that is applied to the memory blocks that are to be erased during the multi-block erasing operation rises based on the number of memory blocks that are to be erased;
   wherein the first voltage is provided by a charge pump, and wherein the charge pump is controlled to provide less charge the smaller the number of memory blocks that are selected to be erased in the multi-block erasing operation.

2. The method of claim 1, wherein the memory device comprises a flash memory device, and wherein the first voltage comprises an erasing voltage that is applied to a substrate of the flash memory device.

3. The method of claim 2, wherein the rate at which the first voltage rises is controlled so that the substrate of the flash memory device reaches the erasing voltage level at approximately the same time regardless of the number of memory blocks that are to be erased.

4. The method of claim 1, wherein the first voltage is applied to each memory cell of the selected memory blocks that is to be erased as part of the multi-block erasing operation.

5. The method of claim 1, wherein word lines of the memory blocks that are to be erased as part of the multi-block erasing operation are driven by a word line voltage and word lines of the remainder of the memory blocks are conditioned in floating states.

6. A method of performing a multi-block erasing operation on a memory device that includes a plurality of memory blocks, the method comprising:
   controlling a rate at which a first voltage that is applied to the memory blocks that are to be erased during the multi-block erasing operation rises based on the number of memory blocks that are to be erased;
   wherein controlling the rate at which the first voltage rises based on the number of memory blocks that are to be erased comprises at least one of:
   (a) adjusting a period of an oscillation signal based on the number of memory blocks that are to be erased and generating the first voltage in response to the oscillation signal having the adjusted period; or
   (b) adjusting a voltage level of an oscillation signal based on the number of memory blocks that are to be erased and generating the first voltage in response to the oscillation signal having the adjusted voltage level; or
   (c) adjusting a capacity of a pump based on the number of memory blocks that are to be erased and generating the first voltage by means of the pump with the adjusted capacity.

7. A method of erasing a flash memory device that includes a plurality of memory blocks, the method comprising:
   determining a number of memory blocks that are to be simultaneously erased;
   setting a slope at which an erasing voltage rises based on a value of the determination; and
   supplying a substrate in which the memory blocks are formed with the erasing voltage which rises at the set slope;
   wherein setting a slope at which the erasing voltage rises based on a value of the determination comprises:
   adjusting a period of an oscillation signal based on a result of the determination as to the number of memory blocks that are to be simultaneously erased; and generating the erasing voltage in response to the oscillation signal having the adjusted period.

8. The method of claim 7, wherein the slope at which the erasing voltage rises is set so that the erasing voltage reaches a pre-selected level at approximately the same time regardless of the number of the memory blocks that are to be erased.

9. The method of claim 7, wherein determining the number of memory blocks that are to be simultaneously erased comprises:
    detecting an input of a multi-block selection command; and
    counting an input number of block addresses in response to detecting the input of the multi-block selection command.

10. The method of claim 7, wherein determining the number of memory blocks that are to be simultaneously erased comprises:
    counting a number of block addresses associated with the multi-block erasing operation.

11. The method of claim 7, wherein word lines of the memory blocks that are to be simultaneously erased are driven by a word line voltage and word lines of the remainder of the memory blocks are conditioned in floating states.

12. The method of claim 7, wherein the period of the oscillation signal is longer the fewer the number of memory blocks that are to be erased.

13. The method of claim 7, wherein setting a slope at which the erasing voltage rises based on a value of the determination comprises:
    adjusting a voltage level of an oscillation signal based on a result of the determination as to the number of memory blocks that are to be simultaneously erased;
    generating the erasing voltage in response to the oscillation signal having the adjusted voltage level.

14. The method of claim 13, wherein the voltage level of the oscillation signal is lower the fewer the number of memory blocks that are to be erased.

15. The method of claim 13, wherein the substrate is a pocket P-well, and wherein the voltage level of the oscillation signal is adjusted to make a time for which the erasing voltage is applied to the pocket P-well more uniform, regardless of the number of the memory blocks that are to be erased.

16. The method of claim 15, wherein word lines of the memory blocks that are to be erased simultaneously are driven by a word line voltage while word lines of the remainder of the memory blocks are conditioned in floating states.

17. The method of claim 7, wherein setting a slope at which the erasing voltage rises based on a value of the determination comprises:
    adjusting a capacity of a pump based on a result of the determination as to the number of memory blocks that are to be simultaneously erased;
    generating the erasing voltage by means of the pump with the adjusted capacity.

18. The method of claim 17, wherein the capacity of the pump is smaller the fewer the number of memory blocks that are to be erased.

19. The method of claim 17, wherein the substrate is a pocket P-well, and wherein the capacity of the pump is adjusted to make a time for which the erasing voltage is applied to the pocket P-well more uniform, regardless of the number of the memory blocks that are to be erased.

20. The method of claim 19, wherein word lines of the memory blocks that are to be erased simultaneously are driven by a word line voltage while word lines of the remainder of the memory blocks are conditioned in floating states.

21. The method of claim 7, wherein the period of the oscillation signal is adjusted to make a time for which the erasing voltage is applied to the substrate more uniform, regardless of the number of the memory blocks that are to be erased.

22. The method of claim 21, wherein determining the number of memory blocks that are to be simultaneously erased comprises:
    detecting an input of a multi-block selection command; and
    counting an input number of block addresses in response to detecting the input of the multi-block selection command.

23. The method of claim 21, wherein word lines of the memory blocks that are to be simultaneously erased are driven by a word line voltage while word lines of the remainder of the memory blocks are conditioned in floating states.

24. The method of claim 21, wherein the substrate is a pocket P-well.

25. A flash memory device comprising:
    a plurality of memory blocks in a semiconductor substrate;
    a first circuit that is configured to determine a number of the plurality of memory blocks that are to be erased;
    an voltage generator that is configured to generate an erasing voltage that is applied to the semiconductor substrate; and
    a control circuit that is configured to perform multi-block erasing operations in which at least two memory blocks are simultaneously erased,
    wherein the control circuit is configured to control the voltage generator, based at least in part on the determination as to the number of memory blocks that are to be erased, to apply the erasing voltage to the semiconductor substrate for approximately the same time regardless of the number of the memory blocks that are to be erased;
    wherein the first circuit comprises:
    a flag signal generator that is configured to generate a pulsed flag signal in response to an input of a block address for selecting a memory block that is to be erased; and
    a counter that is configured to count the number of pulses of the flag signal,
    wherein the control circuit controls the voltage generator in response to the counted number of pulses of the flag signal;
    wherein the voltage generator comprises:
    an oscillator that is configured to generate an oscillation signal;
    a pump that is configured to generate the erasing voltage; and
    a regulator that is configured to control the rate of increase of the erasing voltage in response to the oscillation signal and the erasing voltage,
    wherein the control circuit is configured to regulate the oscillator to vary a period of the oscillation signal based on the determination as to the number of memory blocks that are to be erased.

26. The flash memory device of claim 25, wherein the period of the oscillation signal is longer the fewer the number of memory blocks that are to be erased.

27. The flash memory device of claim 25, wherein the voltage generator comprises:
    an oscillator that is configured to generate an oscillation signal;
    a pump that is configured to generate the erasing voltage; and a regulator that is configured to control the rate of increase of the erasing voltage in response to the oscillation signal and the erasing voltage, wherein the control circuit is configured to regulate the oscillator to vary a voltage level of the oscillation signal based on the determination as to the number of memory blocks that are to be erased.

28. The flash memory device of claim 27, wherein the voltage level of the oscillation signal is longer the fewer the number of memory blocks that are to be erased.

29. The flash memory device of claim 25, wherein the voltage generator comprises:

an oscillator that is configured to generate an oscillation signal;

a pump that is configured to generate the erasing voltage; and a regulator that is configured to control the rate of increase of the erasing voltage in response to the oscillation signal and the erasing voltage, wherein the control circuit is configured to regulate the pump to vary a capacity of the pump based on the determination as to the number of memory blocks that are to be erased.

30. The flash memory device of claim 29, wherein the capacity of the pump is smaller the fewer the number of memory blocks that are to be erased.

31. The flash memory device of claim 25, wherein the substrate comprises a pocket P-well in which the memory blocks are formed.

* * * * *